United States Patent [19]
Wary et al.

[11] Patent Number: 6,051,276
[45] Date of Patent: Apr. 18, 2000

[54] INTERNALLY HEATED PYROLYSIS ZONE

[75] Inventors: John Wary, Noblesville, Ind.; William F. Beach, Bridgewater, N.J.; Roger A. Olson, Amery, Wis.

[73] Assignee: Alpha Metals, Inc., Jersey City, N.J.

[21] Appl. No.: 08/818,537

[22] Filed: Mar. 14, 1997

[51] Int. Cl.$^7$ .................................................. C23C 16/00
[52] U.S. Cl. ...................... 427/255.6; 118/719; 118/724; 118/726
[58] Field of Search .................................... 118/719, 724, 118/726; 427/255.6

[56] References Cited

U.S. PATENT DOCUMENTS

| | | |
|---|---|---|
| 3,211,128 | 10/1965 | Potter et al. . |
| 3,246,627 | 4/1966 | Loeb et al. . |
| 3,301,707 | 1/1967 | Loeb et al. . |
| 3,472,795 | 10/1969 | Tittmann et al. . |
| 3,554,512 | 1/1971 | Elliott . |
| 3,570,449 | 3/1971 | Blecherman . |
| 3,573,968 | 4/1971 | Loeb . |
| 3,600,216 | 8/1971 | Stewart . |
| 3,667,424 | 6/1972 | Cornelius et al. . |
| 3,670,693 | 6/1972 | Rorick et al. . |
| 3,747,558 | 7/1973 | Harel . |
| 3,749,601 | 7/1973 | Tittle . |
| 4,110,392 | 8/1978 | Yamazaki . |
| 4,184,188 | 1/1980 | Briglia . |
| 4,261,762 | 4/1981 | King . |
| 4,323,031 | 4/1982 | Kaplan . |
| 4,362,125 | 12/1982 | Schadler . |
| 4,401,052 | 8/1983 | Baron et al. . |
| 4,468,283 | 8/1984 | Ahmed . |
| 4,495,889 | 1/1985 | Riley . |
| 4,508,055 | 4/1985 | Elton et al. . |
| 4,518,623 | 5/1985 | Riley . |
| 4,577,465 | 3/1986 | Olsen et al. . |
| 4,596,208 | 6/1986 | Wolfson et al. . |
| 4,613,306 | 9/1986 | Bauer et al. . |
| 4,619,844 | 10/1986 | Pierce et al. . |
| 4,683,143 | 7/1987 | Riley . |
| 4,734,533 | 3/1988 | Ungarelli et al. . |
| 4,761,269 | 8/1988 | Conger et al. . |
| 4,783,561 | 11/1988 | Pregaglia et al. . |

(List continued on next page.)

FOREIGN PATENT DOCUMENTS

| | | |
|---|---|---|
| 0 102 417 A1 | 3/1984 | European Pat. Off. . |
| 0 371 796 | 6/1990 | European Pat. Off. . |
| 0 434 227 A1 | 6/1991 | European Pat. Off. . |
| 0 679 373 A2 | 11/1995 | European Pat. Off. . |
| 40 06 489 | 9/1991 | Germany . |
| 650947 | 3/1951 | United Kingdom . |
| 1145005 | 3/1965 | United Kingdom . |
| WO 82/03069 | 9/1982 | WIPO . |

OTHER PUBLICATIONS

L. You, et al., Chemical Perspectives of Microelectronic Materials III Symposium (1992).

J. Apl. Pol. Sci., 13, 2325 Chow, et al.

(List continued on next page.)

*Primary Examiner*—Richard Bueker
*Attorney, Agent, or Firm*—Mintz, Levin, Cohn, Ferris, Glovsky and Popeo, P.C.

[57] ABSTRACT

A method and apparatus for more efficiently depositing a gas onto a surface. In one embodiment, a deposition apparatus is provided. The deposition apparatus comprises a deposition chamber, a tube and a heating element. The tube is in fluid communication with the deposition chamber, and the heating element is constructed and arranged so that the heating element preferentially heats the centerline of the tube relative to the inner surface of the tube. In another embodiment, a method of depositing a product gas onto a surface is provided. The method comprises placing a first gas into a tube; heating first and second portions of the first gas to first and second temperatures, respectively, to form the product gas, the first portion of the first gas being adjacent the centerline of the tube, the second portion of the first gas being adjacent the inner surface of the tube, the first temperature being greater than the second temperature; and depositing the product gas onto the surface.

50 Claims, 4 Drawing Sheets

U.S. PATENT DOCUMENTS

| | | |
|---|---|---|
| 4,795,838 | 1/1989 | Bornengo et al. . |
| 4,816,608 | 3/1989 | Bornengo et al. . |
| 4,846,998 | 7/1989 | Pohl et al. . |
| 4,853,488 | 8/1989 | Ungarelli et al. . |
| 4,877,433 | 10/1989 | Oshitari . |
| 4,883,020 | 11/1989 | Kasai et al. . |
| 4,886,923 | 12/1989 | Ungerelli et al. . |
| 4,902,572 | 2/1990 | Horne et al. . |
| 4,903,754 | 2/1990 | Hirscher et al. . |
| 4,945,856 | 8/1990 | Stewart . |
| 4,957,781 | 9/1990 | Kanegae et al. . |
| 5,002,011 | 3/1991 | Ohmine et al. . |
| 5,007,372 | 4/1991 | Hattori et al. . |
| 5,015,503 | 5/1991 | Varrin, Jr. et al. . |
| 5,078,091 | 1/1992 | Stewart . |
| 5,078,851 | 1/1992 | Nishihata et al. . |
| 5,079,045 | 1/1992 | Luhmann et al. . |
| 5,088,444 | 2/1992 | Ohmine et al. . |
| 5,091,207 | 2/1992 | Tanaka . |
| 5,112,642 | 5/1992 | Wajid . |
| 5,121,707 | 6/1992 | Kanoo . |
| 5,123,375 | 6/1992 | Hansen . |
| 5,129,360 | 7/1992 | Ahern et al. . |
| 5,151,133 | 9/1992 | Ohmine et al. . |
| 5,167,717 | 12/1992 | Boitnott . |
| 5,186,120 | 2/1993 | Ohnishi et al. . |
| 5,217,755 | 6/1993 | Thebault et al. . |
| 5,221,403 | 6/1993 | Nozawa et al. . |
| 5,228,501 | 7/1993 | Tepman et al. . |
| 5,248,370 | 9/1993 | Tsui et al. . |
| 5,248,380 | 9/1993 | Tanaka . |
| 5,250,092 | 10/1993 | Nakano . |
| 5,250,323 | 10/1993 | Miyazaki . |
| 5,254,171 | 10/1993 | Hayakawa et al. . |
| 5,261,963 | 11/1993 | Basta et al. . |
| 5,262,194 | 11/1993 | Bischer, Jr. et al. . |
| 5,264,039 | 11/1993 | Gobush et al. . |
| 5,266,118 | 11/1993 | Mitra . |
| 5,268,033 | 12/1993 | Stewart . |
| 5,268,202 | 12/1993 | You et al. . |
| 5,270,266 | 12/1993 | Hirano et al. . |
| 5,292,554 | 3/1994 | Sinha et al. . |
| 5,302,767 | 4/1994 | Galley et al. . |
| 5,324,540 | 6/1994 | Terada . |
| 5,344,492 | 9/1994 | Sato et al. . |
| 5,350,453 | 9/1994 | Schlosser . |
| 5,401,316 | 3/1995 | Shiraishi et al. . |
| 5,439,525 | 8/1995 | Peichl et al. . |
| 5,447,799 | 9/1995 | Loh et al. . |
| 5,458,687 | 10/1995 | Shichida et al. . |
| 5,470,802 | 11/1995 | Gnade et al. . |
| 5,534,068 | 7/1996 | Beach et al. . |
| 5,536,317 | 7/1996 | Crain et al. . |
| 5,536,321 | 7/1996 | Olson et al. . |
| 5,536,322 | 7/1996 | Wary et al. . |
| 5,556,473 | 9/1996 | Olson et al. . |

OTHER PUBLICATIONS

Chow, S.W., "Poly ($\alpha,\alpha,\alpha',\alpha'$-tetrafluoro–p–xylylene)", *Journal of Applied Polymer Science*, vol. 13, pp. 2325–2332, 1969.

You, L. et al., "Vapor Deposition fo Paraylene Films from Precursors", *Chemical Perspectives of Microelectronics Materials III Symposium.*

Mikami Takashi, "Quartz Crystal Oscillator Type Radical Beam Monitor", Patent Abstracts of Japan, Patent No. 07050258.

Journal of Vacuum Science and Technology A11(6)(1993).

INTERNALLY HEATED PYROLYSIS ZONE

BACKGROUND

1. Field of the Invention

The present invention relates generally to an internally heated pyrolysis zone, and more specifically to such an apparatus that can be used in the vacuum deposition of parylene monomer.

2. Discussion of the Related Art

Conformal coatings having low dielectric constants and high melting temperatures are desirable for many applications, including the medical, electronics and automotive industries. For example, the components of an automobile that are located beneath the hood (e.g., the carburetor) are exposed to various corrosive gases as well as temperatures in excess of 200° C. for extended periods of time.

Conventionally, layers of parylene polymers have been used as conformal coatings since some of these layers are known to have dielectric constants of about 2.3 and melting temperatures of about 540° C. Parylene polymers are poly-p-xylylenes which may be prepared with a parylene dimer. Parylene polymers generally have a structure:

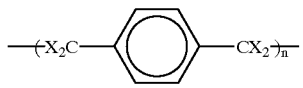

wherein X is typically a hydrogen atom or a halogen atom. The most common forms of parylene dimers include the following:

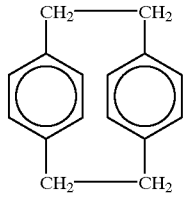

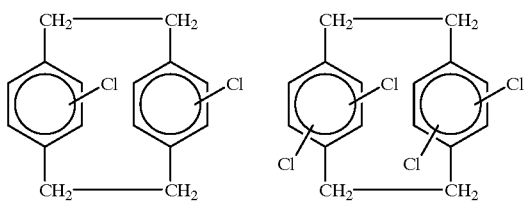

Typically, parylene polymer layers are formed by a vapor deposition method that is performed using a vacuum apparatus 10 as shown in FIG. 1, such as disclosed in U.S. Pat. No. 5,538,758 which is herein incorporated by reference. Apparatus 10 includes a vaporization zone 12, a pyrolysis zone 14, a post-pyrolysis zone 16 and a deposition chamber 18.

In this method, generally referred to as the Gorham process, the parylene dimer is vaporized in vaporization zone 12 and the dimer bond is then cleaved by pyrolysis in pyrolysis zone 14 to form parylene monomer having the structure:

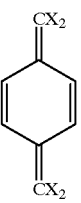

The parylene monomer passes through post-pyrolysis zone 16 which removes a substantial amount of undesired chemical species. The parylene monomer is then deposited onto the surface of a substrate 19 disposed within deposition chamber 18. Polymerization of the deposited parylene monomer occurs spontaneously to form the parylene polymer layer coating on the surface of substrate 19.

FIG. 2 shows a pyrolysis zone 14 which includes a tube 20 with one or more electric tube heaters 22 disposed along the outer surface 24 of wall 26 of tube 20. Heaters 22 increase the temperature of tube 20 to heat the parylene dimer disposed within the interior of tube 20, resulting in cleavage of the parylene dimer bond and formation of the parylene monomer. Due to the arrangement of heaters 22, parylene dimer disposed adjacent the inner surface 28 of wall 26 of tube 20 is maintained at a higher temperature than parylene dimer disposed adjacent the centerline 29 of tube 20. However, since the gas flow rate through tube 20 is generally highest along centerline 29 and lowest along inner surface 28, tube 20 may not be effective in heating the parylene dimer flowing adjacent centerline 29 to a temperature high enough to pyrolyze the parylene dimer and form parylene monomer. At the same time, overpyrolysis of parylene dimer adjacent inner surface 28 can occur, causing a carbonaceous residue to build up on surface 28. Typically, greater than about 1 weight percent of the vaporized parylene dimer results in carbonaceous buildup on inner surface 28.

Thus, it is desirable within the art to provide an apparatus that offers improved efficiency in pyrolyzing a parylene dimer to form parylene monomer which can subsequently be deposited on a surface to yield a parylene polymer layer.

SUMMARY OF THE INVENTION

In one illustrative embodiment, the present invention provides a deposition apparatus that comprises a deposition chamber, a tube and a heating element. The tube is in fluid communication with the deposition chamber, and the heating element is constructed and arranged so that the heating element preferentially heats the centerline of the tube relative to the inner surface of the tube.

In another illustrative embodiment, the present invention provides an apparatus for depositing a gas that comprises a deposition chamber, a tube and means for preferentially heating the centerline of the tube relative to the inner surface of the tube. The tube is in fluid communication with the deposition chamber.

In a further illustrative embodiment, the present invention provides an apparatus for depositing parylene monomer. The apparatus comprises a first zone for providing parylene dimer, a pyrolysis zone, a heating element and a deposition chamber. The pyrolysis zone is designed to pyrolyze the parylene dimer to form the parylene monomer. The pyrolysis zone comprises a tube and a heating element. The tube is in fluid communication with the first zone and the deposition chamber. The heating element is constructed and arranged so that the heating element preferentially heats the centerline of the tube relative to the inner surface of the tube.

In yet a further illustrative embodiment, the present invention provides an apparatus for depositing parylene monomer. The apparatus comprises a first zone for providing parylene dimer, a pyrolysis zone and a deposition chamber. The pyrolysis zone is designed to pyrolyze the parylene dimer to form parylene monomer. The pyrolysis zone comprises a tube and means for preferentially heating the centerline of the tube relative to the inner surface of the tube. The tube is in fluid communication with the first zone and the deposition chamber.

In still a further illustrative embodiment, the present invention provides a method of depositing a product gas onto a surface. The method comprises placing a first gas into a tube; heating first and second portions of the first gas to first and second temperatures, respectively, to form the product gas, the first portion of the first gas being adjacent the centerline of the tube, the second portion of the first gas being adjacent the inner surface of the tube, the first temperature being greater than the second temperature; and depositing the product gas onto the surface.

DETAILED DESCRIPTION

Figure 1:
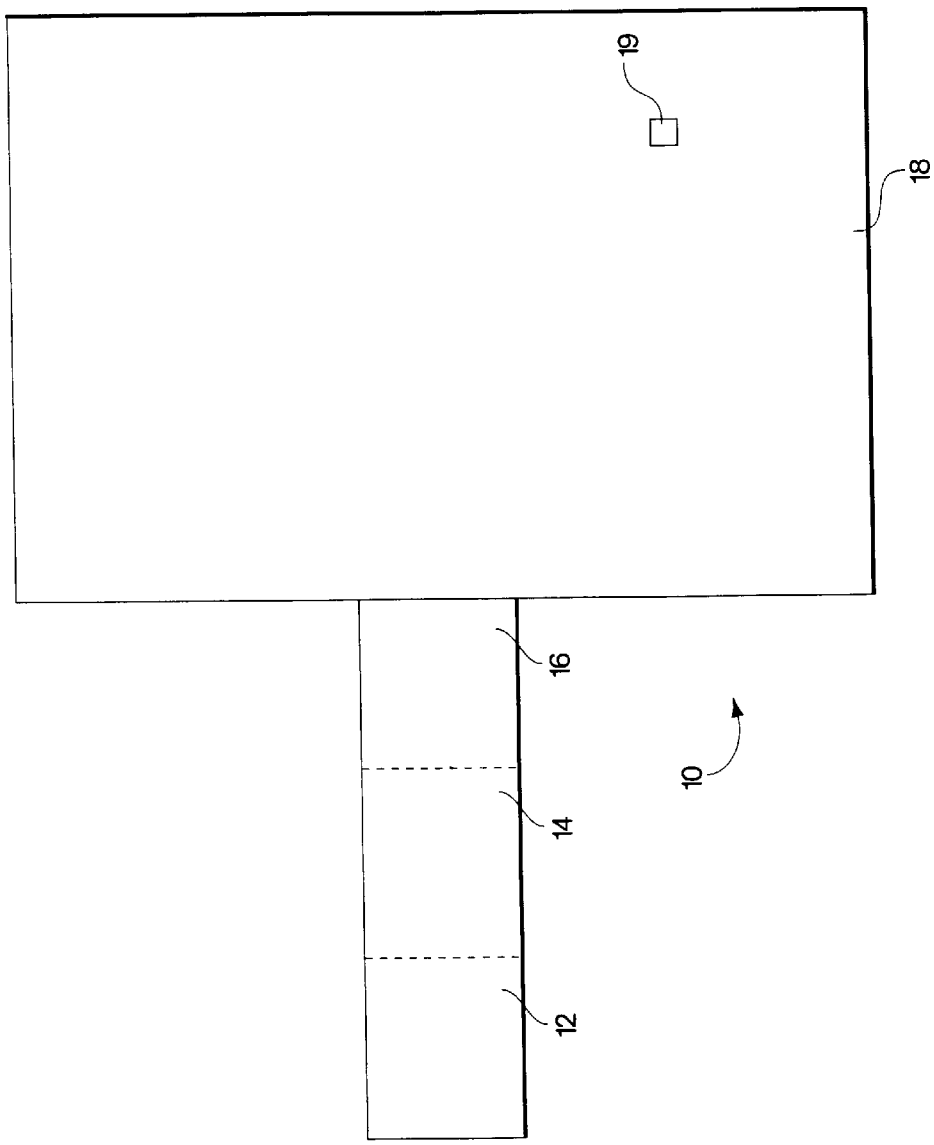
FIG. 1 is a cross-sectional view of a deposition apparatus according to the related art.
Figure 2:
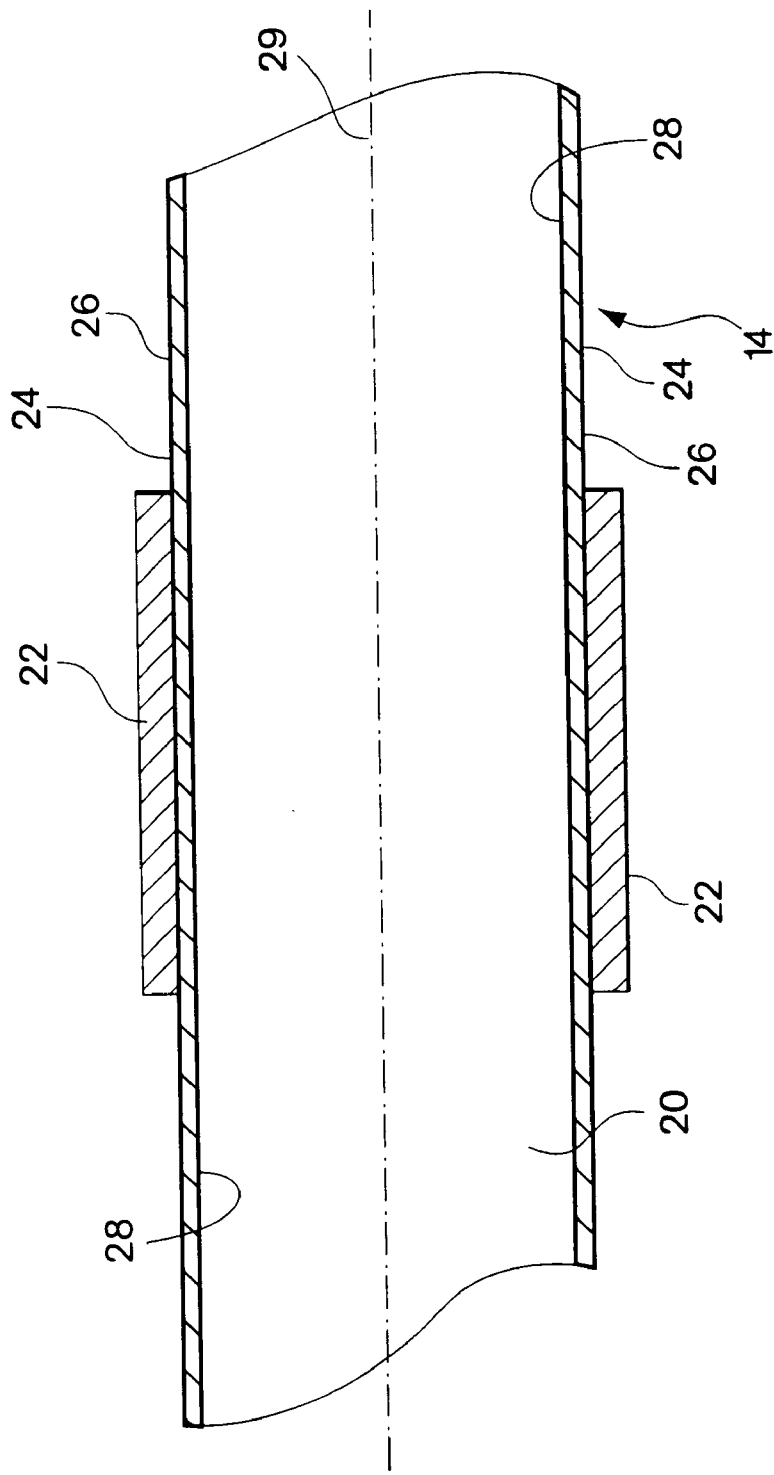
FIG. 2 is a cross-sectional view of a pyrolysis zone according to the related art.
Figure 3:
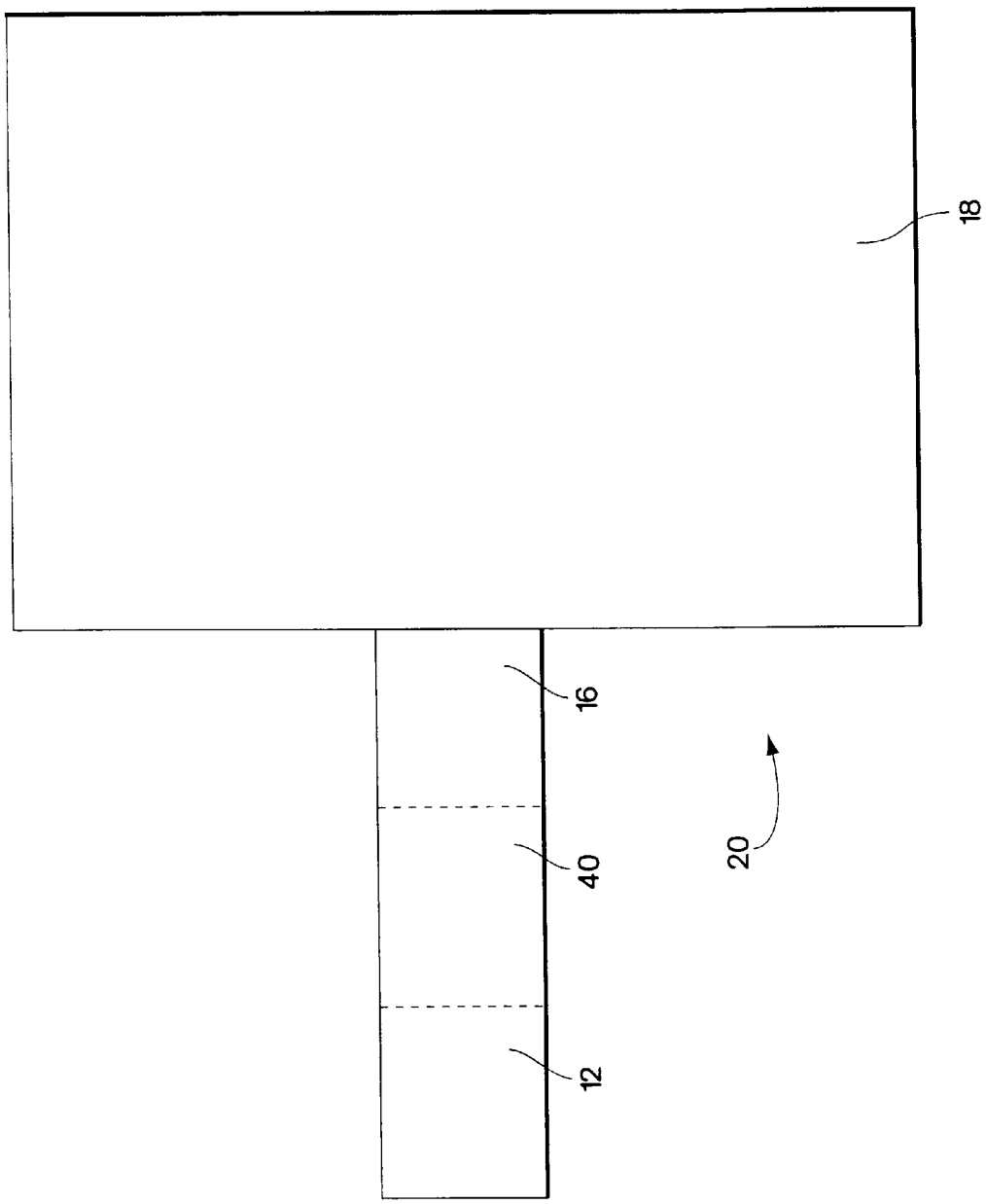
FIG. 3 is a cross-sectional view of a deposition apparatus according to one embodiment the present invention.

FIG. 3 shows one embodiment of a deposition apparatus 20 which includes a vaporization zone 12, a pyrolysis zone 40, a post-pyrolysis zone 16 and a deposition chamber 18. Pyrolysis zone 40 (FIG. 4) includes a tube 42, a heating element 44 disposed substantially along centerline 46 of tube 48 and a power supply 50 in electrical communication with element 44 via electrical connectors 51 and 53.

Tube 42 is designed to be in fluid communication with vaporization zone 12 and post-pyrolysis zone 16 such that vaporized dimer can exit zone 12, be pyrolyzed to parylene monomer within tube 42 and pass to post-pyrolysis zone 16. Since pyrolysis occurs at temperatures of about 1000° C. or less, inner surface 52 of wall 54 of tube 42 should be chemically inert to parylene dimer and parylene monomer within this temperature range. Thus, materials appropriate for use as wall 54 of tube 42 include, but are not limited to, quartz, stainless steel with a quartz inner surface, inconel with a quartz inner surface, monel with a quartz inner surface. Alternatively, the quartz may be partially or entirely replaced with certain ceramics, such as aluminum oxide, or beryllium oxide. Other such materials are known to those skilled in the art and are intended to be within the scope of the present invention.

Tube 42 may have any dimensions that allow tube 42 to be used according to the Gorham process, such as described in U.S. Pat. No. 5,538,758. Typically, tube 42 is from about three feet to about four feet long with a diameter of from about 32 millimeters to about 50 millimeters.

Heating element 44 is designed to heat parylene dimer disposed within tube 42 to form parylene monomer. Element 44 may be heated using ohmic heating produced by applying a potential across element 44 using power supply 50. Therefore, element 44 should be formed from a material which is chemically inert to parylene dimer and parylene monomer at temperature of about 1000° C. or less. An illustrative and nonlimiting list of such materials includes nichrome, platinum, platinum-iridium alloys, tungsten and other such materials which are known to those skilled in the art.

Figure 4:
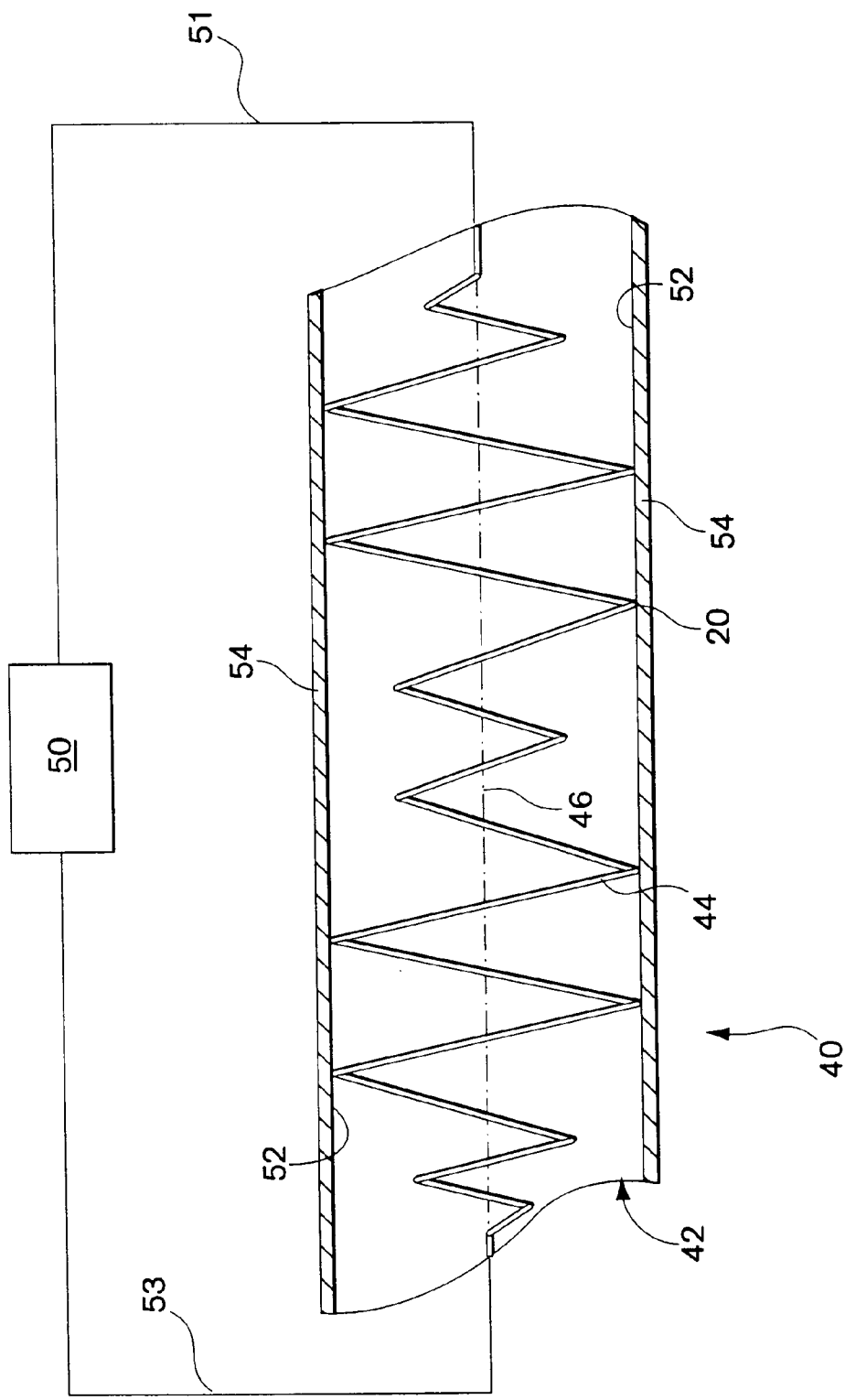
FIG. 4 is a cross-sectional view of a pyrolysis zone according to one embodiment of the present invention.

As shown in FIG. 4, element 44 may be in the shape of a coil with varying diameter. The largest diameter portions of element 44 should have a diameter that is about the same as the inner diameter of tube 44 such that the largest diameter portions of element 44 provide mechanical support for element 44 within tube 42. In other embodiments, element 44 may be have a substantially constant diameter along its entire length within tube 42. For these embodiments, mechanical support for element 44 may be provided by, for example, ceramic spacers, or perforated washers. While certain types of mechanical supports have been disclosed herein, it is to be understood that other supports may also be used so long as they are capable of supporting element 44 in its preferred position. It should be noted that such mechanical supports should not substantially reduce the throughput or flow rate of gas through tube 42. Element 44 is limited only in that it should be capable of preferentially heating a gas disposed along centerline 46 relative to inner surface 52 of tube 42 without substantially reducing the throughput or flow rate of gas through tube 42. Accordingly, in some embodiments, element 44 may be in the form of a mesh, a ribbon wire, a rounded wire, a rod with heat conducting fins or other such arrangements as will be apparent to those skilled in the art.

It is an advantage of the present invention that parylene deposition may be carried out without substantial carbonaceous buildup on inner surface 52 of pyrolysis tube 42. Preferably, less than about 1 weight percent of the vaporized parylene dimer forms carbonaceous material on inner surface 52, more preferably less than about 0.5 weight percent, and most preferably less than about 0.1 weight percent.

It is to be noted that, in certain embodiments, pyrolysis tube 42 may include one or more components formed of pyrex, quartz or similar materials that are bent and disposed within the interior of tube 42 such that a gas flowing through tube 42 can follow a tortuous path. Such devices, often referred to as static mixers, are known to those skilled in the art. For these embodiments, heating element 44 may also be disposed within the interior of tube 42 as described herein.

Having thus described certain embodiments of the present invention, various alterations, modification and improvements will be apparent to those skilled in the art. Such alterations, modifications and improvements are intended to be within the spirit and scope of the present invention. For example, in certain embodiments, deposition apparatus 10 does not include post-pyrolysis zone 16. For these embodiments, tube 48 should be in fluid communication with both vaporization zone 12 and deposition zone 18. Furthermore, in some embodiments, tube 48 may include heating element 44 within the interior of tube 48 and one or more heaters 22 disposed along the outer surface of wall 54. Accordingly, the foregoing description is by way of example only and is not intended as limiting. The invention is limited only as defined by the following claims and the equivalents thereto.

What is claimed is:

1. A deposition apparatus, comprising:
   a deposition chamber;
   a tube in fluid communication with the deposition chamber, the tube having a centerline and an inner surface; and
   a heating element constructed and arranged so that the heating element preferentially heats the centerline of the tube relative to the inner surface of the tube.

2. The deposition apparatus according to claim 1, wherein the heating element is disposed within the interior of the tube.

3. The deposition apparatus according to claim 1, wherein the heating element is disposed adjacent the centerline of the tube.

4. The deposition apparatus according to claim 1, wherein the heating element is disposed along the centerline of the tube.

5. The deposition apparatus according to claim 1, wherein the tube and the heating element form a portion of a pyrolysis zone.

6. The deposition apparatus according to claim 1, further comprising a zone for providing a first gas, the tube being disposed between the zone for providing the first gas and the deposition chamber, the zone for providing the first gas being in fluid communication with the tube.

7. The deposition apparatus according to claim 6, wherein the zone for providing the first gas is a vaporization zone.

8. The deposition apparatus according to claim 7, wherein the tube and the heating element form a portion of a pyrolysis zone, the pyrolysis zone being in fluid communication with the tube.

9. The deposition apparatus according to claim 8, wherein the pyrolysis zone heats the first gas to form a second gas.

10. The deposition apparatus according to claim 9, further comprising a substrate support disposed within the deposition chamber so that the second gas can be deposited on a surface of a substrate disposed along the substrate support.

11. The deposition apparatus according to claim 8, further comprising a post-pyrolysis zone disposed between the deposition chamber and the pyrolysis zone, the post-pyrolysis zone being in fluid communication with the tube.

12. The deposition apparatus according to claim 1, wherein the heating element is a coiled wire.

13. The deposition apparatus according to claim 1, wherein the heating element is a coiled wire having first and second diameters, the first diameter being less than an inner diameter of the tube, the second diameter being about the inner diameter of the tube.

14. The apparatus according to claim 6, wherein less than about 1 weight percent of the first gas vaporized in the zone for providing the first gas results in carbonaceous residue on the inner surface of the tube.

15. An apparatus for depositing a gas, comprising:
   a deposition chamber;
   a tube in fluid communication with the deposition chamber, the tube having a centerline and an inner surface; and
   means for preferentially heating the centerline of the tube relative to the inner surface of the tube.

16. The deposition apparatus according to claim 15, further comprising a zone for providing a gas, the means for preferentially heating the centerline of the tube being disposed between the zone for providing the gas and the deposition chamber, the zone for providing the gas being in fluid communication with the means for preferentially heating the centerline of the tube.

17. The deposition apparatus according to claim 16, wherein the zone for providing the gas is a vaporization zone.

18. The deposition apparatus according to claim 17, further comprising a substrate support disposed within the deposition chamber.

19. The deposition apparatus according to claim 17, further comprising a post-pyrolysis zone disposed between the deposition chamber and the means for preferentially heating the centerline of the tube, the post-pyrolysis zone being in fluid communication with the deposition chamber.

20. The deposition apparatus according to claim 15, wherein the heating element is a coiled wire.

21. The deposition apparatus according to claim 15, wherein the heating element is a coiled wire having first and second diameters, the first diameter being less than an inner diameter of the tube, the second diameter being about the inner diameter of the tube.

22. An apparatus for depositing parylene monomer, comprising:
   a first zone for providing parylene dimer;
   a pyrolysis zone for pyrolyzing the parylene dimer to form the parylene monomer, the pyrolysis zone comprising:
      a tube in fluid communication with the first zone, the tube having an inner surface and a centerline; and
      a heating element constructed and arranged so that the heating element preferentially heats the centerline of the tube relative to the inner surface of the tube; and
   a deposition chamber in fluid communication with the tube.

23. The apparatus according to claim 22, wherein the heating element is disposed within the interior of the tube.

24. The apparatus according to claim 22, wherein the heating element is disposed adjacent the centerline of the tube.

25. The apparatus according to claim 22, wherein the heating element is disposed along the centerline of the tube.

26. The apparatus according to claim 22, wherein the first zone is a vaporization zone.

27. The apparatus according to claim 22, further comprising a substrate support disposed within the deposition chamber so that the parylene monomer can be deposited on a surface of a substrate disposed along the substrate support.

28. The apparatus according to claim 22, further comprising a post-pyrolysis zone disposed between the deposition chamber and the pyrolysis zone, the post-pyrolysis zone being in fluid communication with the tube.

29. The apparatus according to claim 28, further comprising a substrate support disposed within the deposition chamber so that the parylene monomer can be deposited on a surface of a substrate disposed along the substrate.

30. The apparatus according to claim 28, wherein the heating element is disposed within the interior of the tube.

31. The apparatus according to claim 28, wherein the heating element is disposed adjacent the centerline of the tube.

32. The apparatus according to claim 28, wherein the heating element is disposed along the centerline of the tube.

33. The apparatus according to claim 32, wherein the first zone is a vaporization zone.

34. The deposition apparatus according to claim 22, wherein the heating element is a coiled wire.

35. The deposition apparatus according to claim 22, wherein the heating element is a coiled wire having first and second diameters, the first diameter being less than an inner diameter of the tube, the second diameter being about the inner diameter of the tube.

36. The apparatus according to claim 22, wherein less than about 1 weight percent of the parylene dimer vaporized in the first zone results in carbonaceous residue on the inner surface of the tube.

37. An apparatus for depositing parylene monomer, comprising:

a first zone for providing parylene dimer;

a pyrolysis zone for pyrolyzing the parylene dimer to form the parylene monomer, the pyrolysis zone comprising:

a tube in fluid communication with the deposition chamber, the tube having a centerline and an inner surface; and means for preferentially heating the centerline of the tube relative to the inner surface of the tube; and a deposition chamber in fluid communication with the tube.

38. The apparatus according to claim 37, wherein the first zone is a vaporization zone.

39. The apparatus according to claim 37, further comprising a substrate support disposed within the deposition chamber so that the parylene monomer can be deposited on a surface of a substrate disposed along the substrate support.

40. The apparatus according to claim 37, further comprising a post-pyrolysis zone disposed between the deposition chamber and the pyrolysis zone, the post-pyrolysis zone being in fluid communication with the tube.

41. The apparatus according to claim 40, further comprising a substrate support disposed within the deposition chamber so that the parylene monomer can be deposited on a surface of a substrate disposed along the substrate.

42. The apparatus according to claim 41, wherein the first zone is a vaporization zone.

43. The deposition apparatus according to claim 37, wherein the heating element is a coiled wire.

44. The deposition apparatus according to claim 37, wherein the heating element is a coiled wire having first and second diameters, the first diameter being less than an inner diameter of the tube, the second diameter being about the inner diameter of the tube.

45. The apparatus according to claim 37, wherein less than about 1 weight percent of the parylene dimer vaporized in the first zone results in carbonaceous residue on the inner surface of the tube.

46. A method of depositing a product gas onto a surface, the method comprising the steps of:

(a) placing a first gas into a tube;

(b) heating first and second portions of the first gas to first and second temperatures, respectively, to form the product gas, the first portion of the first gas being adjacent a centerline of the tube, the second portion of the first gas being adjacent an inner surface of the tube, the first temperature being greater than the second temperature; and (c) depositing the product gas onto the surface.

47. The method according to claim 46, further comprising, between step (b) and step (c), the step of passing the product gas into a deposition chamber.

48. The method according to claim 46, wherein step (b) includes heating the first and second portions of the first gas with a heating element disposed within an interior of the tube.

49. The method according to claim 46, wherein step (b) includes heating the first and second portions of the first gas with a heating element disposed along a centerline of the tube.

50. The method according to claim 46, wherein step (a) includes placing the first gas into a pyrolysis zone.

* * * * *